United States Patent [19]
Boling et al.

[11] Patent Number: 5,632,650
[45] Date of Patent: May 27, 1997

[54] CONNECTOR BREAK-OFF LOCATOR TAB

[75] Inventors: Clyde W. Boling, Austin; Charles E. Connoley, Round Rock, both of Tex.

[73] Assignee: Minnesota Mining and Manufacturing Company, St. Paul, Minn.

[21] Appl. No.: 554,313

[22] Filed: Nov. 8, 1995

[51] Int. Cl.⁶ ................................................. H01R 13/73
[52] U.S. Cl. ............................................. 439/570; 439/79
[58] Field of Search ............................. 439/572, 79, 80, 439/83, 567, 570, 933, 571, 579

[56] References Cited

U.S. PATENT DOCUMENTS

| | | | |
|---|---|---|---|
| 4,553,801 | 11/1985 | Zajeski | 339/59 |
| 5,106,313 | 4/1992 | Lwee et al. | 439/79 |
| 5,257,947 | 11/1993 | Scheer et al. | 439/567 |
| 5,302,134 | 4/1994 | Thomas et al. | 439/571 |
| 5,317,480 | 5/1994 | Chandraiah et al. | 361/785 |
| 5,330,360 | 7/1994 | Marsh et al. | 439/76 |

FOREIGN PATENT DOCUMENTS

0584728A2  8/1993  European Pat. Off. ......... H05K 5/02

*Primary Examiner*—Neil Abrams
*Assistant Examiner*—T. C. Patel
*Attorney, Agent, or Firm*—Gary L. Griswold; Walter N. Kirn; Matthew B. McNutt

[57] ABSTRACT

Electronic components utilize the waste areas of panelized circuit boards to provide self-fixturing of the components to the circuit boards prior to soldering. The components, connectors in particular, include a main body or housing intended to remain with the circuit board after assembly and one or more locator tabs extending from the housing into the waste area or areas of the panelized circuit board. A weakened area located between the housing and the locator tab facilitates separation of the locator tab from the housing and permits the locator tab or tabs to be easily removed at the same time the waste area of the circuit board is removed from the useful area.

8 Claims, 3 Drawing Sheets

CONNECTOR BREAK-OFF LOCATOR TAB

FIELD OF THE INVENTION

The present invention relates generally to circuit-board mounted connectors, and particularly those used with a panelized circuit board manufacturing method.

1. Background of the Invention

The assembly of large or heavy surface-mounted electronic components to a circuit board usually requires fixtures for retaining the components in a desired position during the soldering process. This fixturing requires manual positioning of the components and therefore does not lend itself readily to automation through the use of robotics capable of placing components in a desired location.

Modern circuit board assembly techniques use so-called "cracker" or panelized boards which include a number of circuit boards connected to each other and adapted to be separated after assembly of components to the boards is completed. These panelized boards include waste areas between adjacent useful circuit board areas.

2. Summary of the Invention

The present invention utilizes the waste areas of panelized circuit boards to provide self-fixturing of electronic devices to the circuit boards prior to soldering. The components, connectors in particular, include a main body or housing intended to remain with the circuit board after assembly and one or more locator tabs extending from the housing into the waste area or areas of the panelized circuit board. A weakened area located between the housing and the locator tab facilitates separation of the locator tab from the housing and permits the locator tab or tabs to be easily removed at the same time the waste area of the circuit board is removed from the useful area.

In particular, the present invention is an electronic device for attachment to a printed circuit board having a waste area adapted to be removed after assembly of components thereto, the device comprising a housing intended to remain attached to the circuit board after completion of assembly, at least one locator tab connected to the housing and intended to be removed from the housing when the waste area is removed from the circuit board, and means projecting from the locator tab for orienting the housing with respect to the circuit board. Preferably a line of weakening between the housing and the locator tab coinciding with an edge of the circuit board waste area is provided, the line of weakening facilitating separation of the locator tab from the housing as the waste area is removed from the circuit board.

The means for orienting the device is preferably a hole in the circuit board waste area and a pin extending from the locator tab of the device. There are preferably two locator tabs, one on each side of the housing and disposed over waste areas on each side of the circuit board. In this case one of the holes in the waste area can be an elongated slot allowing the locating pin to "float" and absorb any tolerances in the parts or accommodate expansion differences between the device and the board attributable to temperature changes during assembly.

The pins may include retention features to ensure retention of the device and support its weight during assembly. This retention feature can be a split pin defining two legs and enlarged ends on the legs. Resiliency of the legs will allow insertion of the split pin into the circuit board hole and the enlarged ends will positively grasp the board.

It is desirable that the reduced section between the housing and the locator tab be as close as possible to the surface of the circuit board to facilitate simultaneous removal of the circuit board waste area and the locator tab, and it would be most desirable if tab could be constructed so that the midpoint of its thickness coincided with the midpoint of the thickness of the circuit board. Such an arrangement would facilitate removal of the board waste area and locator tab by flexing of the two since the neutral axis in flexure of the board and the tab would coincide.

BRIEF DESCRIPTION OF THE DRAWINGS

The present invention will be described with respect to the accompanying drawings, wherein like numbers refer to like parts in the several views, and wherein.

DESCRIPTION OF THE PREFERRED EMBODIMENT

Figure 1:
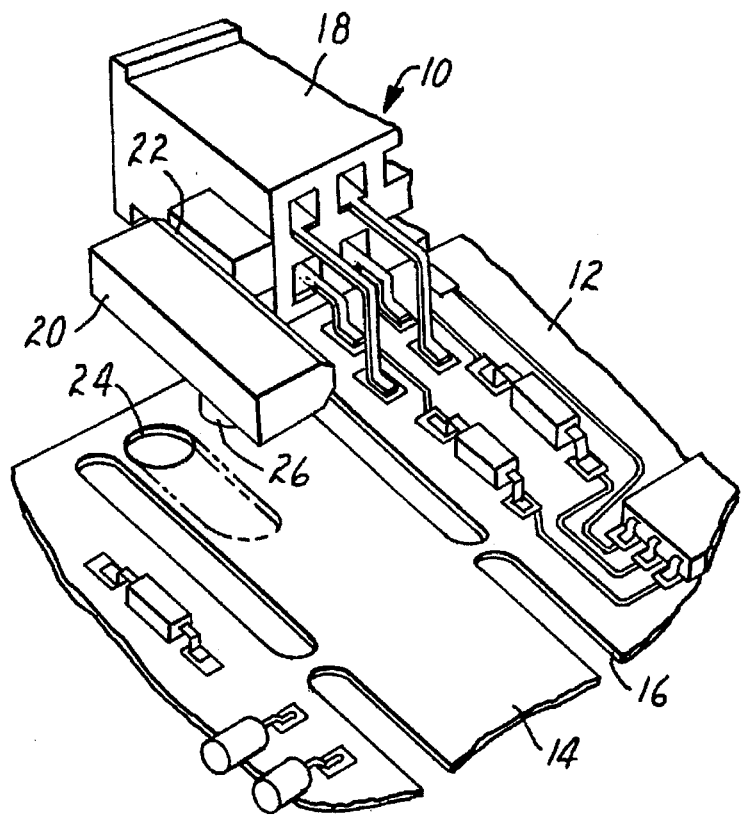
FIG. 1 is a perspective view of a portion of an electronic component according to the present invention and a portion of a panelized circuit board to which the component is assembled.

FIG. 1 illustrates an electronic component, generally indicated as 10, according to the present invention and a panelized circuit board 12 to which the component is assembled. The component 10 is a connector to permit connection of the circuit board 12 to another electronic device, either by connection to a complimentary connector half on another circuit board or a connector half assembled to cabling. The component 10 could be any device which is commonly attached to circuit board, although the device should be one which is attached adjacent an edge of the board 12, as will become apparent later.

The circuit board 12 is one of a series of circuit boards 12 connected to each other by waste areas 14. After assembly of components to each circuit board 12, the circuit boards 12 are separated from the waste areas 14 at lines of perforation 16 extending the length of the boards 12. This separation of the circuit boards 12 from the waste areas 14 can be accomplished by flexing the circuit board 12 relative to the waste area 14 or shearing the larger panelized circuit board at the perforation 16.

Figure 2:
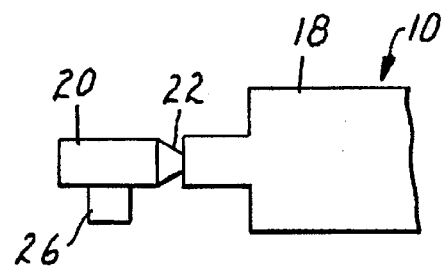
FIG. 2 is a side view of a portion of the component of FIG. 1.
Figure 3:
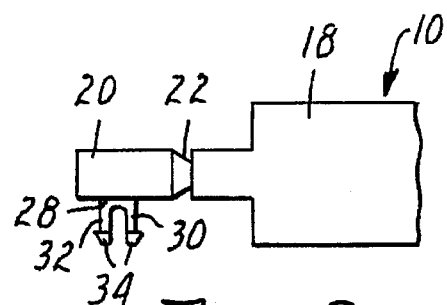
FIG. 3 is a side view of a portion of a first alternate embodiment of a component according to the invention.

The component 10 includes a housing 18 adapted to remain with the circuit board 12 after the board 12 has been separated from the waste area 14, and a locating tab 20 extending laterally from the side of housing 18. As best seen in FIGS. 2 and 3, there is included a dual line of weakening 22 between the housing 18 and the locator tab 20 which coincide with the line of perforations 16 between the circuit board 12 and the waste area 14. Although a line of weakening 22 is shown in both the top and bottom surfaces of the material bridge between the housing 18 and the locator tab 20, only one could be provide in either the top or bottom surface. These lines of weakening 22 can be molded into the component 10 or cut into the surface after molding, and are designed to concentrate stresses when the waste area 14 and the locator tab 20 are flexed relative to the housing 18 and the circuit board 12 and facilitate separation of the locator tab 20 from the housing 18. Of course, if the waste area 14 and locator tab 20 were separated from the housing 18 and the circuit board 12 by shearing, the line of weakening 22 would not be necessary. However, the line of weakening 22 would still be desirable to reduce the thickness of material which must be sheared and possibly to improve the appearance of the sheared edge.

Figure 4:
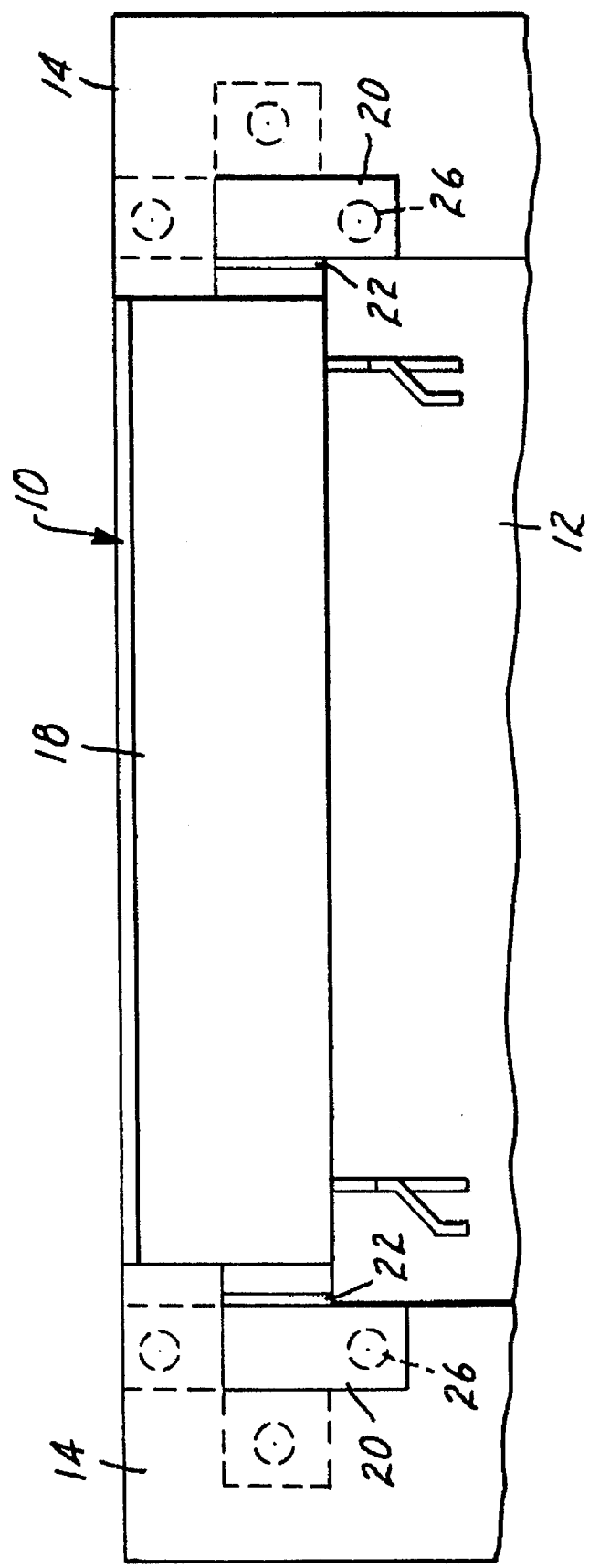
FIG. 4 is an plan view of a second alternate embodiment of a component according to the invention.

FIG. 1 illustrates that the waste area 14 is provided with holes 24, and FIGS. 2 illustrates that the locator tab is provided with a pin 26 adapted for insertion in the hole 24. This pin 26 and hole 24 arrangement locates the component 10 relative to the circuit board 12. If the length of the component permits, it is desirable to provide a locator tab 20 on each side of the housing 18, as may be seen in FIG. 4, to more positively locate the component 10 relative to the circuit board 12. FIG. 4 also illustrates in phantom lines the various positions the locator tabs 20 may assume relative to the housing 10. If the length of the component 10 does not allow locator tabs 20 on each side to reach the waste areas 14 on each side of the circuit board 12, the component 18 can still be positively located by providing a locator tab 20 on one side of the housing 18 having more than one pin 26. Thus in FIG. 4 such a single locator tab 20 would include the solid pin 26 shown and one of the pins shown in phantom. The second pin 26 could also be formed on an elongated portion of the locator tab 20 extending downwardly, from the perspective of FIG. 4, from the solid-line tab 20 shown.

FIG. 3 illustrates that a pin 28 can also be used to retain the component 10 relative to the circuit board 12 in addition to orienting the component 10. The pin 28 is split to produce two resilient legs 30 and 32, and the ends of the legs 30, 32 are formed with enlarged grasping members 34. The resiliency of the legs 30, 32 allow the legs 30, 32 to compress when passing through a hole 24 and force the grasping members 34 outwardly once they have passed the lower edge of the hole 24. Such a grasping arrangement may be necessary if the component 10 is unsteady on the circuit board 12 or projects well beyond the edge of the circuit board 12.

Figure 5:
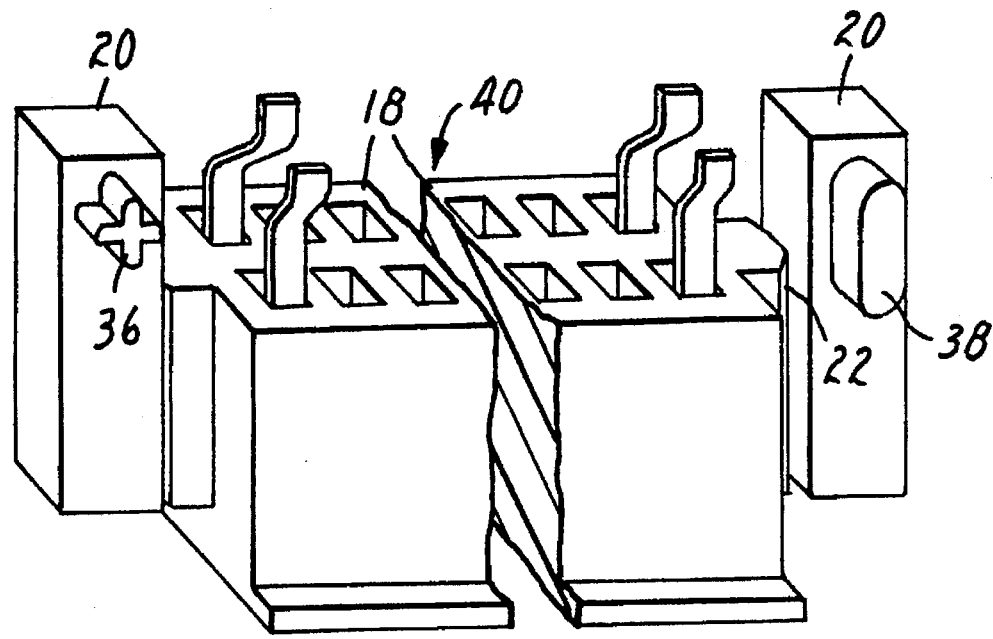
FIG. 5 is perspective view of a third alternate embodiment of a component according to the invention.

FIG. 5 illustrates two types of pins 36 and 38 which may be used to "key" the component 40 to the circuit board 12 and thus prevent incorrect placement of the component 10 on the circuit board 12. The pins 36 and 38 are designed to fit into holes 24 of a similar shape and so will prevent the component 40 from being incorrectly assembled to the circuit board 12.

Figure 6:
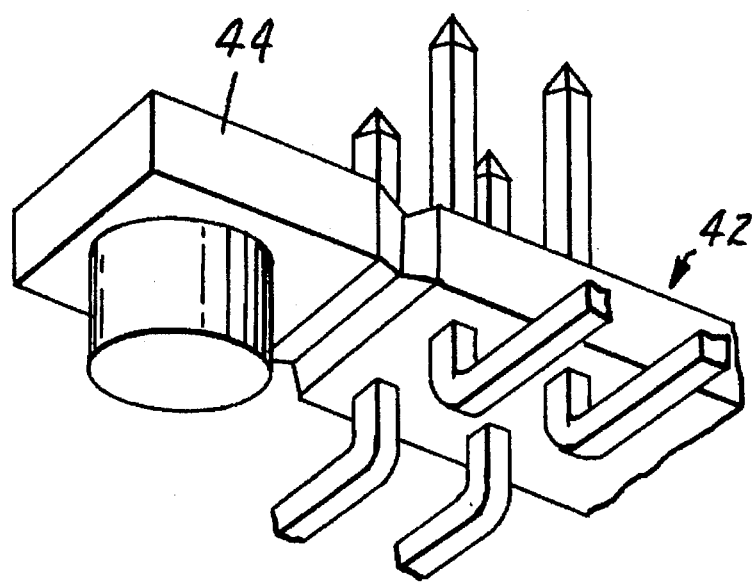
FIG. 6 is a partial perspective view of a fourth alternate embodiment of the invention.

FIG. 6 illustrates that components 42 other than connectors will benefit from the invention. FIG. 6 illustrates a header 42 which utilizes a locator tab 44 for orientation and retention relative to the circuit board. Of course many other devices will benefit from the invention. Any device which has a molded exterior and which will be mounted close to an edge of a circuit board can utilize the invention described above.

Thus there has been described a self-fixturing addition to an electronic device which eliminates the need for other fixtures to orient and retain the device with respect to a circuit board.

The invention claimed is:

1. An electronic device for attachment to a panelized circuit board, the device comprising:

a housing intended to remain attached to one of a plurality of printed circuit boards in a panelized circuit board, wherein adjacent printed circuit boards in the plurality of printed circuit boards are separated by a waste area adapted to be removed after assembly of components to the printed circuit board;

at least one locator tab connected to said housing, said locator tab being disposed over the waste area of the panelized circuit board when the housing is positioned on the printed circuit board, the locator tab intended to be removed from said housing with the waste area of the panelized circuit board;

a line of weakening between said housing and said locator tab coinciding with an edge of the panelized circuit board waste area, said line of weakening facilitating separation of said locator tab from said housing as the waste area is removed from the printed circuit board; and means projecting from said locator tab and into the waste area for orienting said housing with respect to said printed circuit board.

2. A device according to claim 1 wherein said means for orienting said housing includes means for retaining said housing in fixed relationship to the printed circuit board.

3. A device according to claim 1 wherein the waste area of the panelized circuit board includes a hole and said means for orienting is a pin extending from said locator tab and into said hole when the housing is positioned on the printed circuit board.

4. A device according to claim 3 comprising two locator tabs, one tab disposed on each opposite side of said housing, and wherein the panelized circuit board includes two waste areas, one waste area associated with each locator tab.

5. A device according to claim 4 wherein said waste areas each include a hole and said means for orienting includes a pin extending from each of said locator tabs into said holes.

6. A device according to claim 5 wherein one of said holes is an elongated slot to allow movement of said housing relative to said panelized circuit board.

7. A device according to claim 5 wherein said pins include means for retaining said pins within said holes.

8. A device according to claim 7, wherein said means for retaining comprises a split in each of said pins defining resilient legs and enlarged ends on said legs for grasping the panelized circuit board.

* * * * *